US011367744B2

United States Patent
Pang et al.

(10) Patent No.: US 11,367,744 B2
(45) Date of Patent: Jun. 21, 2022

(54) IMAGE SENSOR WITH SHARED MICROLENS AND POLARIZATION PIXEL

(71) Applicant: OmniVision Technologies, Inc., Santa Clara, CA (US)

(72) Inventors: Chin Poh Pang, Pleasanton, CA (US); Boyang Zhang, San Jose, CA (US); Guansong Liu, San Jose, CA (US); Peng Lin, Pleasanton, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 229 days.

(21) Appl. No.: 16/704,877

(22) Filed: Dec. 5, 2019

(65) Prior Publication Data

US 2021/0175270 A1 Jun. 10, 2021

(51) Int. Cl.
*H01L 27/146* (2006.01)
*H04N 5/369* (2011.01)
*H04N 5/378* (2011.01)

(52) U.S. Cl.
CPC .. *H01L 27/14627* (2013.01); *H01L 27/14603* (2013.01); *H01L 27/14621* (2013.01); *H01L 27/14645* (2013.01); *H04N 5/36961* (2018.08); *H04N 5/36965* (2018.08); *H04N 5/378* (2013.01)

(58) Field of Classification Search
CPC ........ H01L 27/14627; H01L 27/14621; H04N 5/36961
See application file for complete search history.

(56) References Cited

U.S. PATENT DOCUMENTS

| 5,890,095 | A | 3/1999 | Barbour et al. |
| 7,002,627 | B1 | 2/2006 | Raffy et al. |
| 8,530,266 | B1 | 9/2013 | Chen et al. |
| 9,443,899 | B1 | 9/2016 | Liu et al. |
| 9,807,294 | B2 | 10/2017 | Liu et al. |
| 10,015,389 | B2 | 7/2018 | Lu et al. |
| 10,260,866 | B2 | 4/2019 | Kadambi et al. |
| 10,694,169 | B1* | 6/2020 | Topliss .................. G06T 7/408 |
| 2015/0358597 | A1 | 12/2015 | Pang et al. |
| 2016/0150199 | A1 | 5/2016 | Wu et al. |

(Continued)

OTHER PUBLICATIONS

Jang, J., et al., "Sensor-Based Auto-Focusing System Using Multi-Scale Feature Extraction and Phase Correlation Watching," Sensors, 2015, vol. 15, pp. 5747-5762.

(Continued)

*Primary Examiner* — Thanh Luu
(74) *Attorney, Agent, or Firm* — Christensen O'Connor Johnson Kindness PLLC (57) ABSTRACT

An image sensor pixel comprises a subpixel and a polarization pixel. The subpixel includes a group of photodiodes disposed in semiconductor material, a shared microlens optically aligned over the group of photodiodes, and a subpixel color filter disposed between the group of photodiodes and the shared microlens. The polarization pixel includes a first photodiode disposed in the semiconductor material, an unshared microlens optically aligned over the first photodiode, and a polarization filter disposed between the first photodiode and the unshared microlens. The shared microlens has a first lateral area. The unshared microlens has a second lateral area less than the first lateral area of the shared microlens.

20 Claims, 6 Drawing Sheets

(56) References Cited

U.S. PATENT DOCUMENTS

| | | | |
|---|---|---|---|
| 2016/0286108 A1* | 9/2016 | Fettig | H04N 9/04557 |
| 2017/0171470 A1* | 6/2017 | Sakioka | H01L 27/14623 |
| 2018/0040104 A1* | 2/2018 | Lukac | H04N 9/646 |
| 2019/0096945 A1 | 3/2019 | Lu et al. | |

OTHER PUBLICATIONS

Kadambi, A., et al., "Polarized 3D: High-Quality Depth Sensing with Polarization Cues," ICCV, 2015, 9 pages.

Yuffa, A.J., et al., "Three-dimensional facial recognition using passive long-wavelength infrared polarimetric imaging," Applied Optics, vol. 53, No. 36, Dec. 2014, 9 pages.

* cited by examiner

IMAGE SENSOR WITH SHARED MICROLENS AND POLARIZATION PIXEL

TECHNICAL FIELD

This disclosure relates generally to image sensors, and in particular but not exclusively, relates CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Embodiments of an apparatus, system, and method each including or otherwise related to an image sensor with a shared microlens and a polarization pixel are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Embodiments described herein utilize an image sensor with an architecture that may include a plurality of subpixels each structured with a shared microlens to provide phase information of an external scene (e.g., for phase detection auto focus, depth mapping, and the like) as well as color information to generate an image or video of the external scene. Further still, the architecture of the image sensor may also include a plurality of polarization pixels structured to provide surface normal angle information of the external scene. Advantageously, phase information provided by the plurality of subpixels may be combined with the surface normal angle information to provide depth mapping that is compatible for a wide variety of scenes. For example, the phase information from the plurality of subpixels with shared microlenses may provide phase information or relative depth information of edges of the external scene that contrast one another (e.g., when transitioning to different objects of the external scene). The relative depth information may be combined with the surface angle information provided by the polarization pixels to accurately generate a depth map image when even portions of the external scene change depth without significant contrast differences (e.g., when an individual object itself has change width and is thus not a uniform distance from the image sensor such as the case of a sphere). Enhanced depth mapping is accomplished, at least in part, based on the specific architecture of the image pixel or image sensor described in embodiments of the disclosure.

Additionally, in some embodiments, individual subpixels may be multi-functional to provide color image data (e.g., color information representative of portions of the external scene) and phase information for objective focusing (i.e., phase detection auto focus). In one embodiment, the plurality of subpixels have an architecture that includes shared microlenses optically aligned over respective groups of photodiodes to enable a single sensor solution for multi-directional phase detection auto focus (PDAF). In other words, in addition to providing color information, each subpixel may also be utilized as a phase detection pixel to provide phase information for determining whether a point of interest (POI) within the image frame is in focus. The phase information may then be subsequently used in response to generate multi-directional guidance as to how an objective lens of an imaging system should be adjusted when the POI is out of focus. Advantageously, embodiments described herein provide a single sensor solution for dense and omni-directional phase difference calculations for substantially instant autofocus.

FIGS. 1A-1D illustrate representative views of an image sensor 100. It is appreciated that the views presented in FIGS. 1A-1D may omit certain elements of image sensor 100 to avoid obscuring details of the disclosure. In other words, not all elements of image sensor 100 may be labeled, illustrated, or otherwise shown within an individual one of FIGS. 1A-1D. It is further appreciated that in some embodiments, image sensor 100 may not necessarily include all elements shown in FIGS. 1A-1D.

Figure 1A:
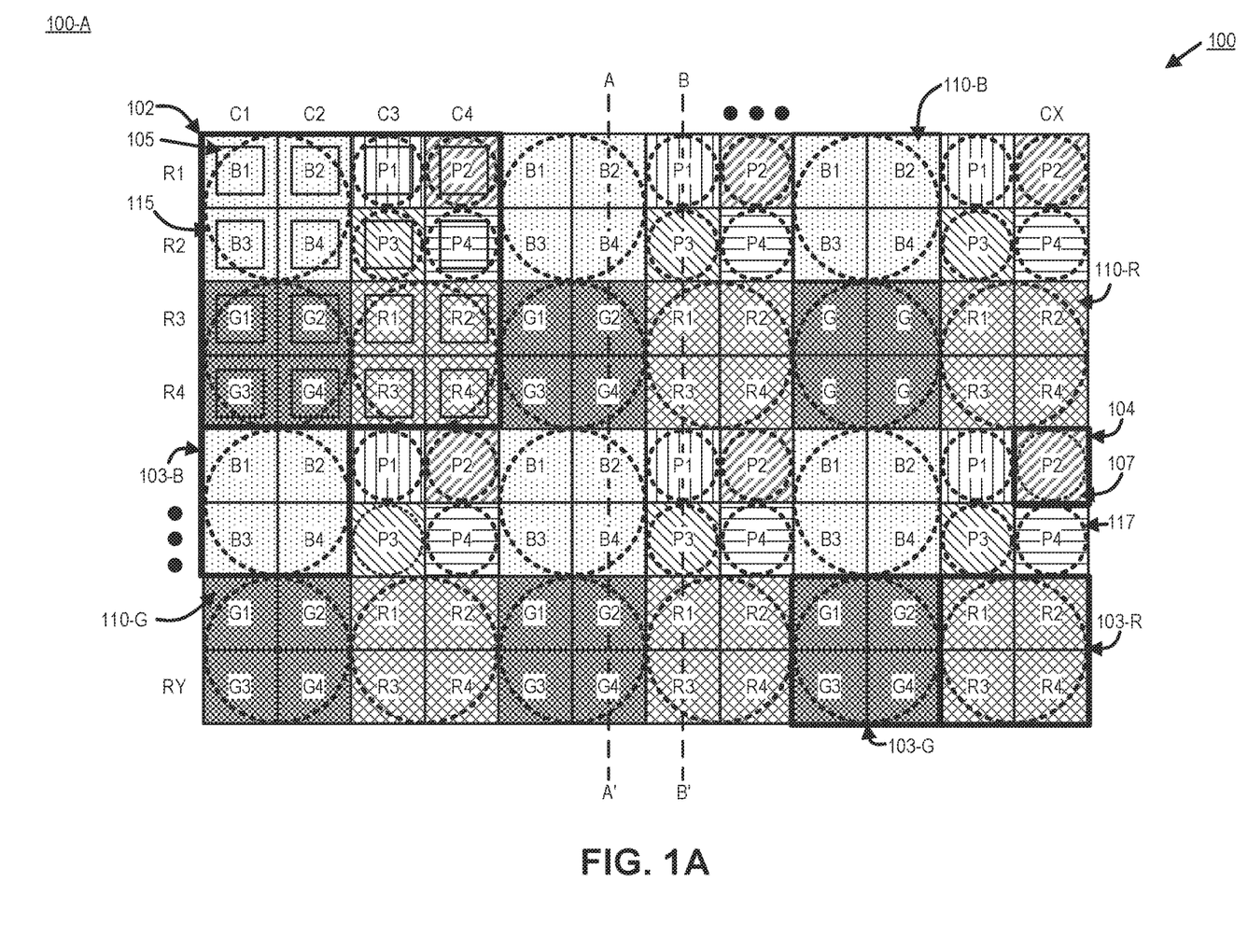
FIG. 1A illustrates a top view of an image sensor with an image pixel including a shared microlens and a polarization pixel, in accordance with the teachings of the present disclosure.

FIG. 1A illustrates a top view 100-A of image sensor 100 with a shared microlens 115 and a polarization pixel 104, in accordance with the teachings of the present disclosure. Image sensor 100 includes an image pixel 102, which may be representative of any image pixel included in a plurality of image pixels that collectively form image sensor 100. Image pixel 102 may be a minimal repeat unit of image sensor 100 and includes a plurality of subpixels 103 (e.g., a blue subpixel 103-B, a green subpixel 103-G, and a red subpixel 103-R) and a plurality of polarization pixels 104 (e.g., P1, P2, P3, and P4). The image sensor 100 includes, inter alia, a plurality of photodiodes 105 (e.g., B1, B2, B3, B4, G1, G2, G3, G4, R1, R2, R3, R4, P1, P2, P3, P4, and so on) arranged in rows (e.g., R1, R2, R3, RY) and columns (e.g., C1, C2, C3, CX) as a photodiode array, a plurality of subpixel color filters 110 (e.g., 110-G, 110-B, 110-R), a plurality of polarization filters 107, a plurality of shared microlenses 115, and a plurality of unshared microlenses 117. Components of image sensor 100 are optically aligned to form the plurality of subpixels 103 and plurality of polarization pixels 104 of image sensor 100 for capturing images (e.g., color images, depth map images, video, and the like) while also providing phase detection auto focus.

Figure 1B:
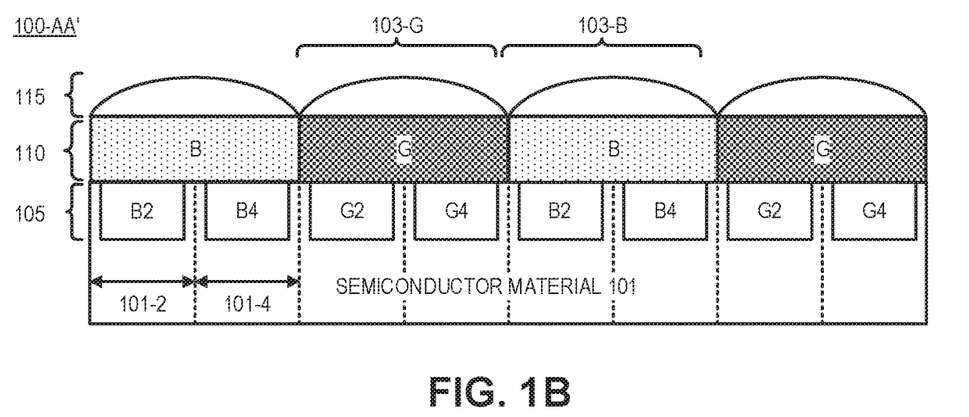
FIGS. 1B-1C illustrate different cross-sectional views of an image sensor with a shared microlens and a polarization pixel, in accordance with the teachings of the present disclosure.
Figure 1C:
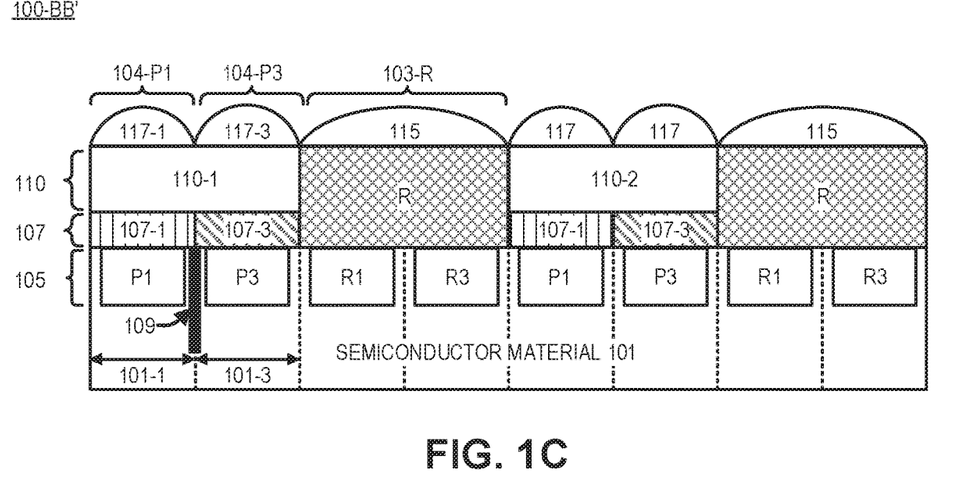

In some embodiments, the plurality of photodiodes 105 are arranged in a regular, repeating manner such that the plurality of photodiodes 105 are positioned or otherwise disposed within a semiconductor material at regular intervals to form a square or rectangular photodiode array. The individual photodiodes included in the plurality of photodiodes 105 may correspond to doped regions within respective portions of the semiconductor material that are responsive to incident light (e.g., the doped regions may form a PN junction that generates image charge proportional to a magnitude or intensity of the incident light). It is appreciated that the plurality of photodiodes 105 are disposed within the semiconductor material (see, e.g., FIGS. 1B and 1C) and may be optically aligned with respective subpixel color filters (e.g. 110-B, 110-G, or 110-R), polarization filters 107, shared microlenses 115, unshared microlenses 117, and the like to form an individual subpixel included in the plurality of subpixels 103 or an individual polarization pixel included in the plurality polarization pixels 104 for each image pixel of image sensor 100. Thus, for the sake of clarity, view 100-A illustrated in FIG. 1A generally refers to a given subpixel included in the plurality of subpixels 103 or a given polarization pixel included in the plurality of polarization pixels 104 by the labeled photodiode reference without necessarily showing an exemplary size, shape, or position of the given photodiode. Additionally, each and every element included in image sensor 100 may not necessarily be labeled or shown. However, it is noted that exemplary cross-sectional views of image sensor 100 are shown in FIGS. 1B-1C and an exemplary relative size comparison of certain elements is provided in FIG. 1D.

Referring back to FIG. 1A, image pixel 102 is representative of any individual image pixel included in the plurality of image pixels that collectively form image sensor 100. Image pixel 102 includes a plurality of polarization pixels 104 (e.g., P1, P2, P3, P4) and a plurality of subpixels 103 (e.g., a green subpixel 103-G, a blue subpixel 103-B, and a red subpixel 103-R). Each of the plurality of polarization pixels 104 includes an unshared microlens 117 optically aligned over a respective photodiode (e.g., the corresponding photodiode associated with P1, P2, P3, or P4) included in the photodiode array (i.e., plurality of photodiodes 105) and a polarization filter 107. In other words, an unshared microlens 117 may not extend over more than one column and one row of the photodiode array. Each of the plurality of subpixels 103 include a shared microlens 115 optically aligned over a group of photodiodes (e.g., B1, B2, B3, and B4) and a subpixel color filter 110. In the illustrated embodiment, the group of photodiodes associated with a given one of the plurality of subpixels 103 includes four photodiodes collectively arranged in a two-by-two pattern. Thus, in the illustrated embodiment, each shared microlens 110 extends over two rows and two columns included in the photodiode array to cover the four photodiodes.

In some embodiments, the plurality of polarization pixels 104 are grouped together to cover a similar area as an individual one of the plurality of subpixels 103. In the illustrated embodiment, four polarization pixels included in the plurality of polarization pixels 104 are arranged adjacent to one another in a two-by-two pattern to form a respective group of polarization pixels (e.g., P1, P2, P3, and P4) that is, at least partially, surrounded by the plurality of subpixels 103. More specifically, each image pixel 102 may include three subpixels (e.g., a green subpixel 103-G, a blue subpixel 103-B, and a red subpixel 103-R) collectively arranged to form an "L" shape disposed, at least partially, around the plurality of polarization pixels 104 (e.g., a group of polarization pixels that includes P1, P2, P3, and P4) to form a minimal repeat unit of the image sensor 100 (e.g., image pixel 102). In one embodiment, a group of polarization pixels of an image pixel includes four polarization pixels (e.g., the group of polarization pixels located in columns 7-8 and rows 5-6 of FIG. 1A) that are collectively surrounded by a first group of the plurality of subpixels 103 (e.g., the subpixels located within columns 5-10 and rows 3-8). The first group of the plurality of subpixels includes four green subpixels 103-G, two blue subpixels 103-B, and two red subpixels 103-R. As illustrated in FIG. 1A, the four green subpixels 103-G are arranged diagonally adjacent to the four polarization pixels while the two blue subpixels 103-B and two red subpixels 103-R are arranged laterally adjacent to the four polarization pixels (e.g., positioned vertically or horizontally of the four polarization pixels when viewed from a top-down perspective as illustrated in FIG. 1A).

As illustrated in FIG. 1A, image pixel 102 is a full color image pixel (e.g., capable of generating image signals in response to incident light that may collectively represent at least the visible portion of the electromagnetic spectrum) and includes a plurality of subpixels (e.g., a red subpixel 103-R, a green subpixel 103-G, and a blue subpixel 103-B). Each subpixel 103 includes a corresponding shared microlens 115 to direct light through a subpixel color filter 110 towards a respective group of photodiodes included in the photodiode array. In contrast, each unshared microlens 117 is unshared with respect to the plurality of photodiodes 105 and thus respectively directs light through a polarization filter 107 toward a single one of the plurality of photodiodes 105 to form a corresponding polarization pixel 104. In some embodiments, polarization pixels 104 are grouped together (e.g., in two-by-two groups) that are each laterally surrounded by a plurality of subpixels 103. However, it is appreciated that the term "laterally surrounds" does not necessarily mean fully encapsulates. Rather, as shown in FIG. 1A, there may be spacing and/or a separation distance between individual photodiodes, microlenses, and subpixel color filters in accordance with embodiments of the disclosure. Further still, in some embodiments, other components (e.g., vias, wiring, circuitry, isolation trenches, and the like) may be disposed within the spacing.

Each of the microlenses (e.g., shared microlenses 115 and/or unshared microlenses 117) may be formed of a polymer (e.g., polymethylmethacrylate, polydimethylsiloxane, etc.) or other material and be shaped to have optical power for converging, diverging, or otherwise directing light incident upon the microlenses through a corresponding optically aligned one of the plurality subpixel color filters 110 and/or polarization filters 107 to a respective one or more photodiodes included in the plurality of photodiodes 105.

To facilitate being a full color image pixel, image pixel 102 includes a plurality of subpixel color filters 110 that have a respective spectral photoresponse. The term "spectral photoresponse" describes the portion of the electromagnetic spectrum that the color filter (e.g., subpixel color filter 110-G, 110-B, 110-R, and the like) transmits. For example, a spectral photoresponse corresponding to green (G) indicates that the color filter will transmit a portion of the electromagnetic spectrum corresponding to green light while substantially absorbing or reflecting other portions of the electromagnetic spectrum that do not correspond to green light. Similarly, a spectral photoresponse corresponding to panchromatic or clear indicates that the color filter substantially transmits a portion of electromagnetic spectrum corresponding to the visible spectrum of light while substantially absorbing or reflecting regions of the electromagnetic spectrum outside of the visible range (e.g., UV, IR, etc. if the photodiode has spectral response outside of the visible range). In some embodiments, the spectral photoresponse for blue, green, red, and clear subpixel color filters correspond to frequency ranges within the electromagnetic spectrum of approximately 450 nm to 490 nm, 520 nm to 560 nm, 635 nm to 700 nm, and 400 nm to 700 nm, respectively. In some embodiments, the plurality of subpixel color filters 110 included in the plurality of subpixels 103 may have a spectral photoresponse corresponding to any one of red, green, blue, panchromatic (i.e., clear or white), yellow, cyan, magenta, or other colors, individually or in combination.

It is appreciated that image sensor 100 may be fabricated by semiconductor device processing and microfabrication techniques known by one of ordinary skill in the art. In one embodiment, fabrication of image sensor 100 may include providing a semiconductor material (e.g., a silicon wafer having a front side and a back side), forming a mask or template (e.g., out of cured photo resist) on the front side of the semiconductor material via photolithography to provide a plurality of exposed regions of the front side of semiconductor material, doping (e.g., via ion implantation, chemical vapor deposition, physical vapor deposition, and the like) the exposed portions of the semiconductor material to form the plurality of photodiodes 105 that extend into semiconductor material from the front side of semiconductor material, removing the mask or template (e.g., by dissolving the cured photoresist with a solvent), and planarizing (e.g., via chemical mechanical planarization or polishing) the front side of semiconductor material. In the same or another embodiment, photolithography may be similarly used to form the plurality of subpixel color filters 110 (e.g., via cured pigmented polymers having a desired spectral photoresponse), the plurality of shared microlens 115, the plurality of unshared microlens 117 (e.g., polymer based microlenses having a target shape and size formed from a master mold or template), and the plurality of polarization filters (e.g., metal grids or lines structured or otherwise arranged to linearly polarization light to a predetermined degree). It is appreciated that the described techniques are merely demonstrative and not exhaustive and that other techniques may be utilized to fabricate one or more components of image sensor 100.

FIG. 1B illustrates a cross-sectional view 100-AA' along line A-A' of image sensor 100 shown in FIG. 1A, in accordance with the teachings of the present disclosure. Specifically, the cross-sectional view 100-AA' is along a column of image sensor 100 that includes a plurality of subpixels (e.g., green subpixel 103-G and blue subpixel 103-B) but does not include any polarization pixels 104 as shown in FIG. 1A.

Referring back to FIG. 1B, image sensor 100 includes the plurality of shared microlenses 115, the plurality of subpixel color filters 110, and the plurality of photodiodes 105 disposed in respective portions of semiconductor material 101 (e.g., silicon). Each of the plurality of subpixel color filters 110 (e.g., B for a blue spectral photoresponse, G for a green spectral photoresponse, and the like) is optically aligned between a group of photodiodes (e.g., B2 and B4) and one of the plurality of shared microlenses 115 to form a corresponding subpixel included in the plurality of subpixels (e.g., 103-G,103-B, and the like). Thus, each of the plurality of subpixel color filters 110 extends across a corresponding group of photodiodes. Similarly, each of the plurality of shared microlenses 115 is optically aligned with or otherwise extends across the corresponding group of photodiodes.

In the illustrated embodiment, each of the respective portions of semiconductor material 101 (e.g., 101-2, 101-4, and the like) include a respective one of the plurality of photodiodes 105. It is appreciated that individual photodiodes included in the plurality of photodiodes 105 do not necessarily extend laterally across the entire cross-sectional area of the respective portions of semiconductor material 101. Rather, portions of semiconductor material 101 disposed between adjacent photodiodes (e.g., region of semiconductor material 101 between photodiodes B2 and B4) may be utilized to form additional structures within the semiconductor material 101 (e.g., isolation trenches, floating diffusion, and the like).

FIG. 1C illustrates a cross-sectional view 100-BB' along line B-B' of image sensor 100 shown in FIG. 1A, in accordance with the teachings of the present disclosure. Specifically, the cross-sectional view 100-BB' is along a column of image sensor 100 that includes a plurality of subpixels 103 (e.g., red subpixel 103-R, and the like) and a plurality of polarization pixels 104 (e.g., 104-P1, 104-P3, and the like) as shown in FIG. 1A.

Referring back to FIG. 1C, image sensor 100 includes the plurality of shared microlenses 115, the plurality of unshared microlenses 117, the plurality of subpixel color filters 110 (e.g., R for a red spectral photoresponse, and the like), the plurality of polarization filters 107, the plurality of photodiodes 105 disposed in respective portions (e.g., 101-1, 101-3, and the like) of the semiconductor material 101, and an optional deep trench isolation structure 109.

In the illustrated embodiment, a given polarization pixel (e.g., first polarization pixel 104-P1) of an image pixel for image sensor 100 includes a first photodiode (e.g., P1) disposed in a respective portion (e.g., 101-1) of the semiconductor material 101, an unshared microlens (e.g., 117-1) optically aligned over the first photodiode, and a polarization filter (e.g., 107-1) disposed between the first photodiode and the unshared microlens. The polarization filter 107 is configured to provide linear polarization of light incident upon the polarization filter. In one embodiment, the polarization filter 107 may be a wire grid polarizer that includes an array of thin metal lines or wires positioned along a common plane (e.g., on top of or otherwise proximate to a first side of the semiconductor material 101 between the plurality of photodiodes 105 and the plurality of subpixel color filters 110 and/or plurality of unshared microlenses 117). The separation distance and angle of orientation of the metal lines of a given polarization filter 107 may be configured to obtain a desired degree of linear polarization of incident light. In some embodiments the degree of polarization provided by the polarization filter 107 may be zero, forty-five-ninety, one hundred thirty-five, or other degrees of polarization. In one embodiment, the plurality of polarization pixels 104 are grouped together (e.g., 104-P1 and 104-P3) in a two-by-two pattern (e.g., as shown in FIG. 1A) for a given image pixel. Each group of polarization pixels may subsequently be laterally surrounded by a group of subpixels. In the same or other embodiments, each group of polarization pixels 104 may provide different degrees of linear polarization to incident light. In one embodiment, a group of four polarization pixels (e.g., P1, P2, P3, and P4 illustrated in FIG. 1A and partially illustrated in FIG. 1C) arranged in a two-by-two pattern may provide a degree of linear polarization of zero, forty-five, ninety, and one hundred thirty-five degrees, respectively.

As shown in FIG. 1C, the plurality of polarization filters 107 are disposed between the plurality of subpixel color filters 110 and the plurality of photodiodes 105. In some embodiments, the subpixel color filter 110 (e.g., 110-1) optically aligned with the plurality of polarization pixels 107 may have a spectral photoresponse corresponding to green or clear. In other embodiments, there may be no subpixel color filter optically aligned over the photodiodes associated with the plurality of polarization pixels 104. In some embodiments the plurality of polarization filters 107 have a negligible thickness such that the thickness of subpixel color filters 110 disposed over the polarization pixels 104 and the plurality of subpixels 103 are substantially equal. In the same or other embodiments, the plurality of subpixel color filters 110 may be planarized such that the microlenses (e.g., the plurality of shared microlenses 115 and the plurality of unshared microlens 117) are substantially aligned along a common plane of image sensor 100.

In the illustrated embodiment, image sensor 100 includes deep trench isolation structures 109 (e.g., formed of an oxide within the semiconductor material 101 such as silicon oxide) disposed between adjacent photodiodes (e.g., P1 and P3) included in the plurality of photodiodes 105 that may reduce electrical crosstalk between photodiodes. As illustrated, the deep trench isolation structures 109 extend into the semiconductor material 101 beyond a depth of the plurality of photodiodes 105. However, in other embodiments there may be shallow trench isolation structures that do not extend within the semiconductor material 101 beyond the depth of the plurality of photodiodes 105. In other embodiments, there may be no isolation structures disposed between the plurality of photodiodes 105.

Figure 1D:
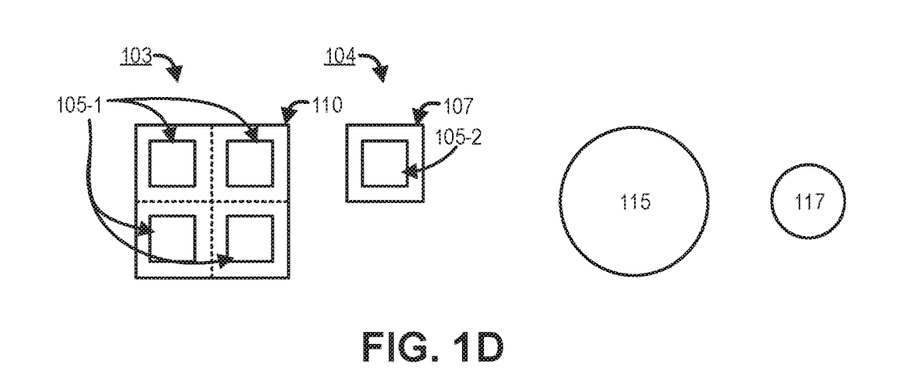
FIG. 1D illustrates a relative size comparison between a subpixel color filter, a polarization filter, a shared microlens, and an unshared microlens included in an image pixel of an image sensor, in accordance with the teachings of the present disclosure.

FIG. 1D illustrates a relative size comparison between first subpixel color filter 110, polarization filter 107, shared microlens 115, and unshared microlens 117 included in an image pixel of image sensor 100 shown in FIGS. 1A-1C, in accordance with the teachings of the present disclosure. Subpixel 103 includes a group of photodiodes 105-1 arranged in a two-by-two pattern of photodiodes that are optically aligned with subpixel color filter 110. Polarization pixel 104 includes photodiode 105-2 optically aligned with polarization filter 107. As illustrated, the shared microlens 115 has a first lateral area and the unshared microlens 117 has a second lateral area less than the first lateral area of the shared microlens 115. The subpixel color filter 110 has a third lateral area greater than the first lateral area of the shared microlens 115. The polarization filter 107 has a fourth lateral area greater than the second lateral area of the unshared microlens 117. The third lateral area of the subpixel color filter 110 is greater than the fourth lateral area of the unshared microlens 117. In some embodiments, the relative size comparison between the subpixel color filter 110, the polarization filter 107, the shared microlens 115, and the unshared microlens 117 of a given subpixel 103 and polarization pixel 104 may be representative of each and every subpixel and/or polarization pixel included in image sensor 100 illustrated in FIGS. 1A-1C as well as other embodiments of the disclosure.

Figure 2A:
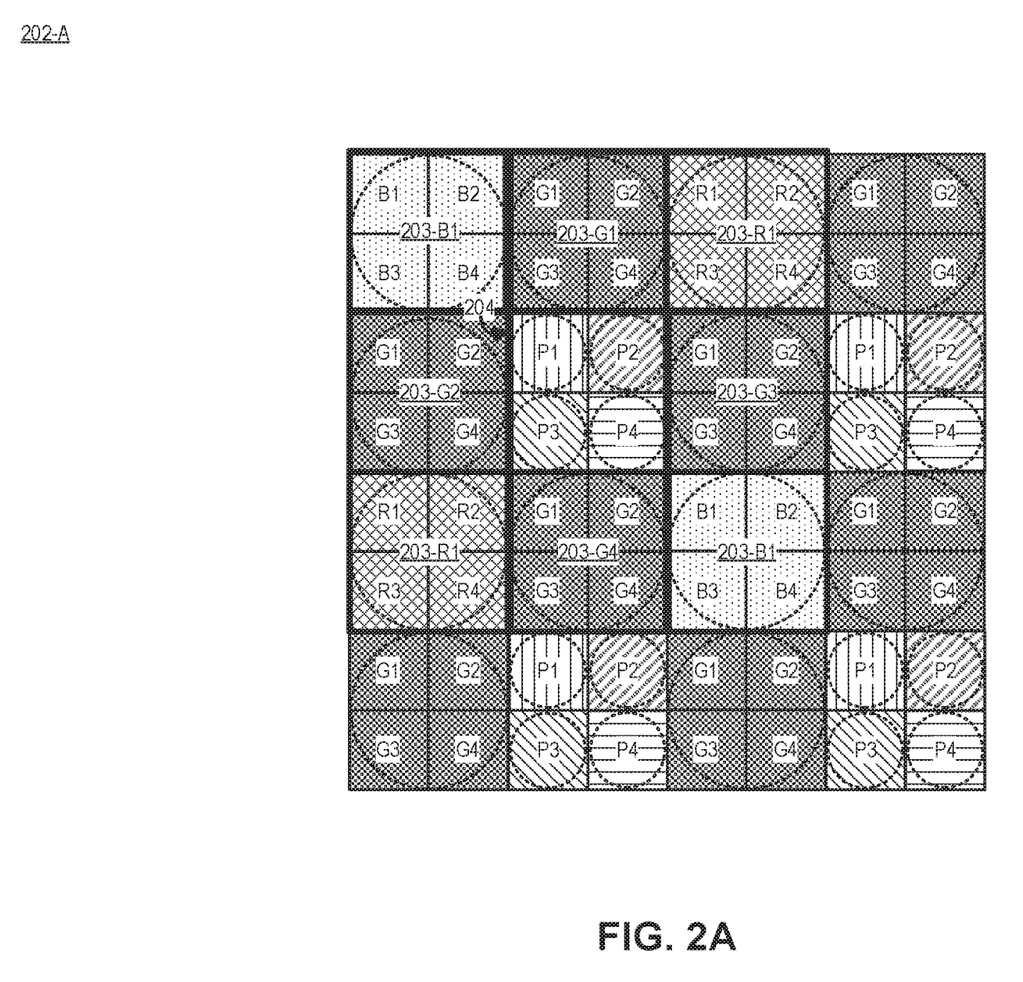
FIG. 2A illustrates a top view of a minimal repeat unit of an image sensor with a shared microlens and a polarization pixel, in accordance with the teachings of the present disclosure.

FIG. 2A illustrates a top view of a minimal repeat unit 202-A of an image sensor with shared microlens 215 and polarization pixel (e.g., P1, P2, P3, or P4), in accordance with the teachings of the present disclosure. Minimal repeat unit 202-A is one possible implementation of image sensor 100 illustrated in FIGS. 1A-1D. More specifically, minimal repeat unit 202-A represents an alternative arrangement of subpixels and polarization pixels included in image sensor 100. As illustrated in FIG. 2A, minimal repeat unit 202-A includes a plurality of subpixels (e.g., green subpixels 203-G, blue subpixels 203-B, and red subpixels 203-R) and groups of polarization pixels 204 included in a plurality of polarization pixels. Similar to FIG. 1A, the group of polarization pixels 204 is included in an image pixel and includes four polarization pixels arranged in a two-by-two pattern that is collectively surrounded by a group of the plurality of subpixels that includes four green subpixels (e.g., 203-G1, 203-G2, 203-G3, and 203-G4), two red subpixels (e.g., 203-R1 and 203-R2), and two blue subpixels (e.g., 203-B1 and 203-B2). However, the specific arrangement of the group of subpixels is different than the embodiment illustrated in FIG. 1A. Rather, FIG. 2A shows the four green subpixels (e.g., 203-G1, 203-G2, 203-G3, and 203-G4) are arranged laterally adjacent to the four polarization pixels included in the group of polarization pixels 204. The two blue subpixels (e.g., 203-B1 and 203-B2) and two red subpixels (e.g., 203-R1 and 203-R2) are arranged diagonally adjacent to the four polarization pixels included in the group of polarization pixels 204.

FIGS. 2B-2E illustrate exemplary subpixels (e.g., 203-9PD illustrated in FIG. 2B and 203-16PD illustrated in FIG. 2D) and grouped polarization pixels (e.g., 204-9PD illustrated in FIG. 2C and 204-16PD illustrated in FIG. 2E) of an imaging system, in accordance with the teachings of the present disclosure. The illustrated subpixels and polarization pixels shown in FIGS. 2B-2E represent possible implementations of subpixels and groups of polarization pixels illustrated in FIGS. 1A-1D.

Figure 2B:
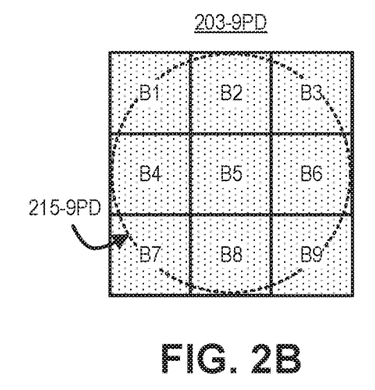
FIGS. 2B-2E illustrate exemplary subpixels and grouped polarization pixels of an imaging system, in accordance with the teachings of the present disclosure.

FIG. 2B illustrates a subpixel 203-9PD of an image pixel included in an image sensor. The subpixel 203-9PD includes a shared microlens 215-9D that extends over a group of nine photodiodes (e.g., B1, B2, B3, B4, B5, B6, B7, B8, and B9) arranged in a three-by-three pattern. Subpixel 203-9PD may include a subpixel color filter disposed between the shared microlens 215-9PD and the group of nine photodiodes that may have a spectral photoresponse of blue, as illustrated, or any one of red, green, yellow, magenta, panchromatic, or otherwise.

Figure 2C:
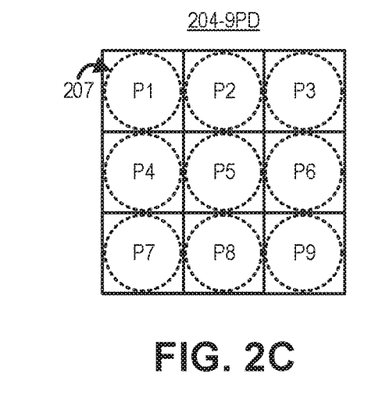

FIG. 2C illustrates a group of polarization pixels 204-9PD that may be paired with subpixel 203-9PD of FIG. 2B to create a similar minimal repeat unit or arrangement of subpixels and polarization pixels comparable to the minimal repeat units illustrated in FIG. 1A and FIG. 2A. Referring back to FIG. 2C, the group of polarization pixels 204-9PD includes nine polarization pixels (e.g., P1, P2, P3, P4, P5, P6, P7, P8, and P9) arranged in a three-by-three pattern with each polarization pixel optically coupled to a respective unshared microlens 207. Each individual polarization pixel may include a polarization filter that linearly polarizes incident light. The degree of linear polarization may be zero, forty-five, ninety, one hundred thirty-five, or otherwise.

Figure 2D:
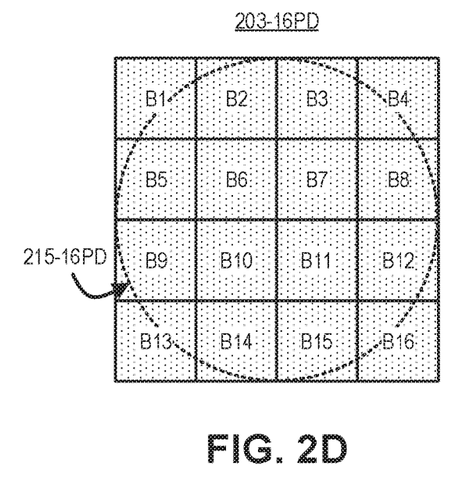

FIG. 2D illustrates a subpixel 203-16PD of an image pixel included in an image sensor. The subpixel 203-16PD includes a shared microlens 215-16D that extends over a group of sixteen photodiodes (e.g., B1, B2, B3, B4, B5, B6, B7, B8, B9, B10, B11, B12, B13, B14, B15, and B16) arranged in a four-by-four pattern. Subpixel 203-16PD may include a subpixel color filter disposed between the shared microlens 215-16PD and the group of sixteen photodiodes that may have a spectral photoresponse of blue, as illustrated, or any one of red, green, yellow, magenta, panchromatic, or otherwise.

Figure 2E:
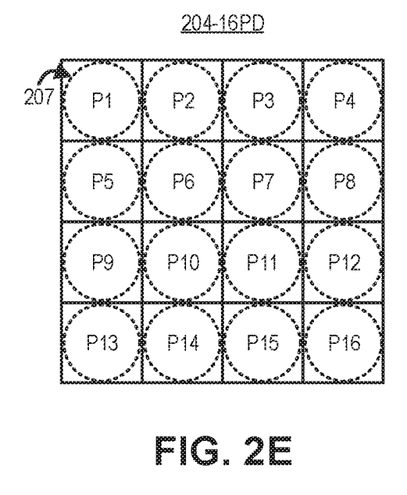

FIG. 2E illustrates a group of polarization pixels 204-16PD that may be paired with subpixel 203-16PD of FIG. 2D to create a similar minimal repeat unit or arrangement of subpixels and polarization pixels comparable to the minimal repeat units illustrated in FIG. 1A and FIG. 2A. Referring back to FIG. 2E, the group of polarization pixels 204-16PD includes sixteen polarization pixels (e.g., P1, P2, P3, P4, P5, P6, P7, P8, P9, P10, P11, P12, P13, P14, P15, and P16) arranged in a four-by-four pattern with each polarization pixel optically coupled to a respective unshared microlens 207. Each individual polarization pixel may include a polarization filter that linearly polarizes incident light. The degree of linear polarization may be zero, forty-five, ninety, one hundred thirty-five, or otherwise.

Figure 3:
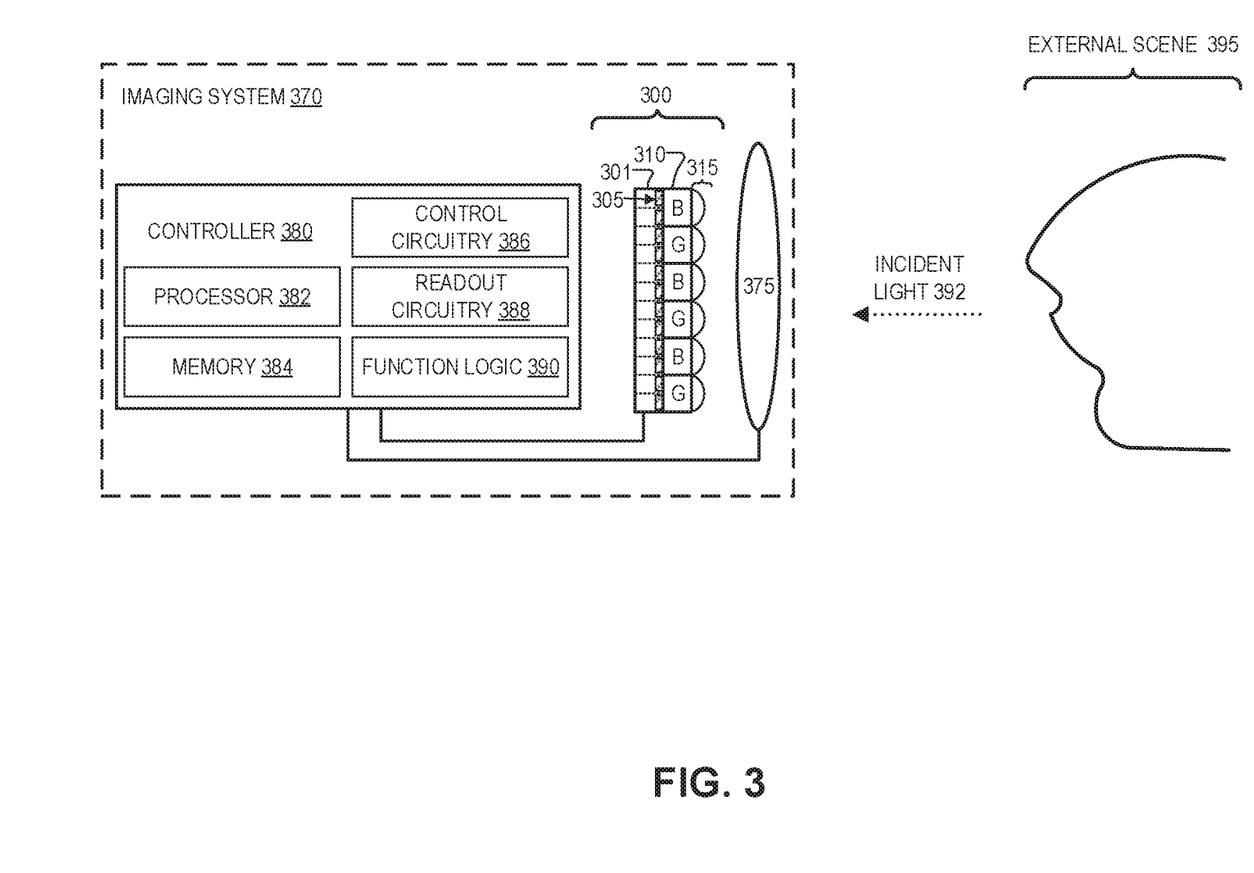
FIG. 3 is a functional block diagram of an imaging system including an image sensor with shared microlenses and polarization pixels, in accordance with the teachings of the present disclosure.

FIG. 3 is a functional block diagram of an imaging system 370 including an image sensor 300 with shared microlenses and polarization pixels, in accordance with the teachings of the present disclosure. Imaging system 370 is capable of focusing on a point of interest (POI) within an external scene 395 in response to incident light 392. Imaging system 370 includes image sensor 300 to generate electrical or image signals in response to incident light 392, objective lens(es) 375 with adjustable optical power to focus on one or more points of interest within the external scene 392, and controller 380 to control, inter alia, operation of image sensor 300 and objective lens(es) 375. Image sensor 300 is one possible implementation of image sensor 100 illustrated in FIGS. 1A-1D and includes semiconductor material 301 with a plurality of photodiodes 305 disposed within respective portions of the semiconductor material 301, a plurality of subpixel color filters 310, and a plurality of shared microlenses 315 arranged in a manner described in manner similar to any one of the embodiments described in FIGS. 1A-2E. The controller 380 illustrated in FIG. 3 includes one or more processors 382, memory 384, control circuitry 386, readout circuitry 388, and function logic 390.

The controller 380 includes logic and/or circuitry to control the operation (e.g., during pre-, post-, and in situ phases of image and/or video acquisition) of the various components of imaging system 370. The controller 380 may be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 380 includes the processor 382 coupled to memory 384 that store instructions for execution by the controller 380 or otherwise by one or more components of the imaging system 370. The instructions, when executed by the controller 380, may cause the imaging system 370 to perform operations that may associated with the various functional modules, logic blocks, or circuitry of the imaging system 370 including any one of, or a combination of, the control circuitry 386, the readout circuitry 388, the function logic 390, image sensor 300, objective lens 375, and any other element of imaging system 370 (illustrated or otherwise). The memory is a non-transitory computer-readable medium that may include, without limitation, a volatile (e.g., RAM) or non-volatile (e.g., ROM) storage system readable by controller 380. It is further appreciated that the controller 380 may be a monolithic integrated circuit, one or more discrete interconnected electrical components, or a combination thereof. Additionally, in some embodiments the one or more electrical components may be coupled to one another to collectively function as the controller 380 for orchestrating or otherwise controlling operation of the imaging system 370.

Control circuitry 386 may control operational characteristics of the imaging system 370 (e.g., exposure duration, when to capture digital images or videos, and the like). Readout circuitry 388 reads or otherwise samples the analog signal from the individual photodiodes (e.g., read out electrical signals generated by each of the plurality of photodiodes 305 that are representative of image charge generated in response to incident light to generate a phase detection auto focus signal, read out image signals to capture an image frame or video, generate a depth map image, and the like) and may include amplification circuitry, analog-to-digital (ADC) circuitry, image buffers, or otherwise. In the illustrated embodiment, readout circuitry 388 is included in controller 380, but in other embodiments readout circuitry 388 may be separate from the controller 380. Function logic 390 is coupled to the readout circuitry 388 to receive the electrical signals to generate a phase-detection auto focus (PDAF) signal in response, generate an image in response to receiving image signals or data, generate a depth map of an external scene in response to receiving electrical signals, and the like. In some embodiments, the electrical or image signals may be respectively stored as a PDAF signal or image data and may be manipulated by the function logic 390 (e.g., calculate an expected image signal, bin image signals, demosaic the image data, apply post image effects such as crop, rotate, remove red eye, adjust brightness, adjust contrast, or otherwise).

Figure 4:
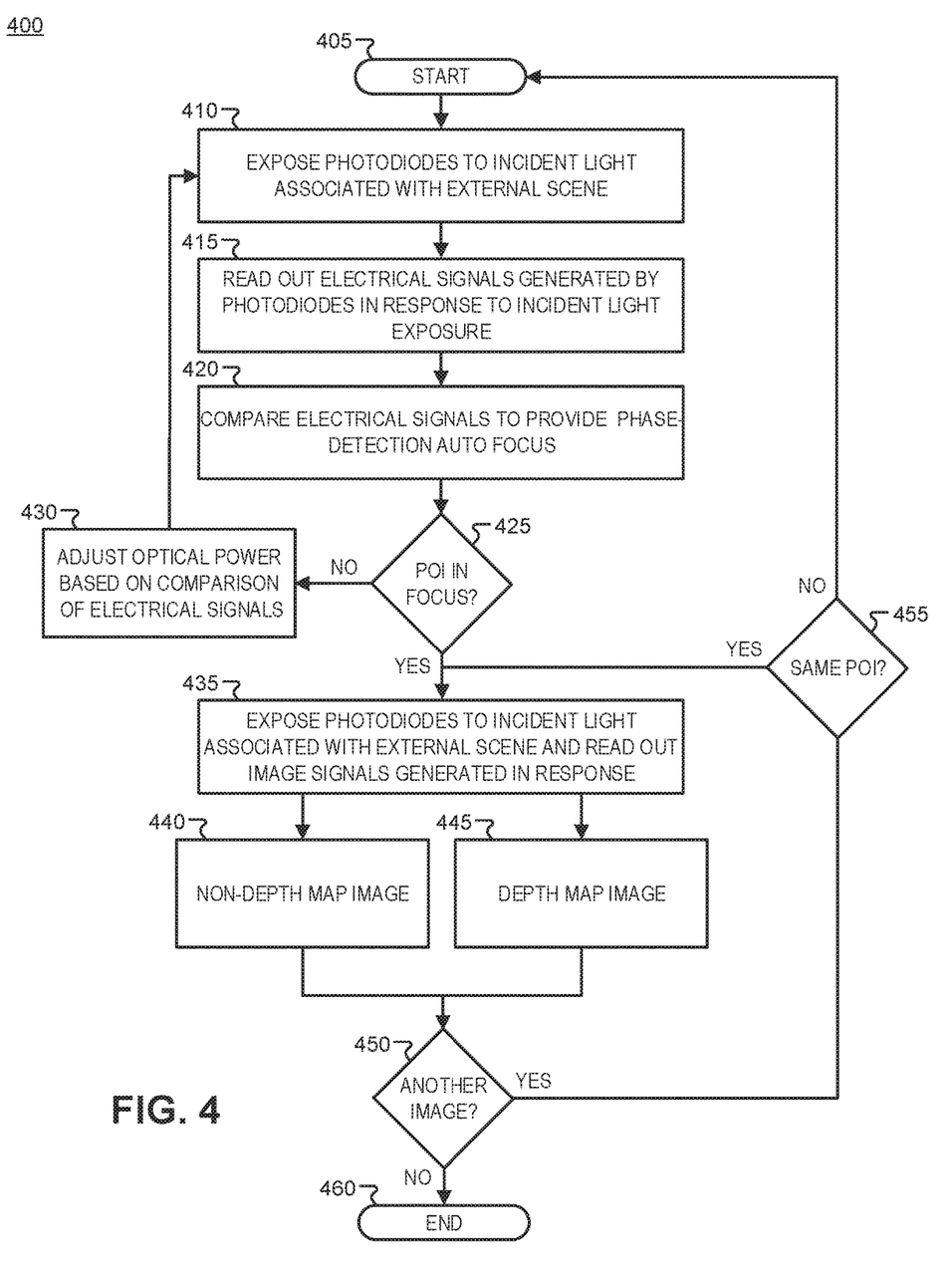
FIG. 4 shows an example method for capturing an image with an imaging system including an image sensor with shared microlenses and polarization pixels, in accordance with the teachings of the present disclosure.

FIG. 4 shows an example method 400 for capturing an image with an imaging system including an image sensor with shared microlenses and polarization pixels, in accordance with the teachings of the present disclosure. In some embodiments method 400 may be implemented by imaging system 370 illustrated in FIG. 3 and/or any of image sensor 100 illustrated in FIGS. 1A-1D. It is appreciated that the numbered blocks of method 400, including blocks 405-460, may occur in any order and even in parallel. Additionally, blocks may be added to, or removed from, method 400 in accordance with the teachings of the present disclosure.

Block 405 illustrates initialization of method 400 upon receipt of a signal (e.g., a depressed shutter button of the imaging system) to capture an image or video frame representative of an external scene. During initialization, a point of interest (POI) of the external scene to be imaged by the image sensor may be provided (e.g., selected by a user of the imaging system), automatically detected (e.g., during a subsequent step with a phase detection auto-focus signal), or otherwise obtained. The POI may represent one or more regions of the external scene that are desired to be in focus.

Blocks 410-430 show steps for generating a phase detection auto focus (PDAF) signal using an image sensor with shared microlenses and, if necessary, adjusting optical power of an objective lens to configure the imaging system to focus on one or more points of interest as illustrated in various embodiments of the disclosure. More specifically, the utilized image sensor (e.g., image sensor 100 illustrated respectively in FIGS. 1A-1D) include a plurality of image pixels. Each of the image pixels include a plurality of subpixels that may each correspond to a phase detection pixel. Each subpixel includes a group of photodiodes (e.g., four photodiodes arranged in a two-by-two pattern) that are optically aligned with a shared microlens.

Block 410 illustrates exposing the plurality of photodiodes to incident light associated with an external scene. In response to the incident light the plurality of photodiodes generates image charge proportional to the intensity of the incident light. The image charge is subsequently stored (e.g., in a floating diffusion) for each of the plurality of subpixels and may subsequently be read out as electrical signals. It is appreciated that the term "electrical" and "image" signals may be used interchangeably and are both representative of the image charge that is generated by the plurality of photodiodes in response to incident light. In some embodiments, the modifier "electrical" or "image" that proceeds the term "signal" may respectively indicate that the signal is being used for auto focus/depth mapping or image/video capture.

Block 415 shows reading out electrical signals (e.g., via readout circuitry 388 illustrated in FIG. 3) in response to the incident light. Electrical signals may be read out individually from respective photodiodes included in the plurality of photodiodes (e.g., by transferring the image charge generated in each of the photodiodes as an electrical signal one row at a time to column storage capacitors, and then reading out the elements individually using a column decoder coupled to a multiplexer). Specifically, the electrical signals generated by the group of photodiodes included in each subpixel may be read out for generating a phase-detection auto focus signal that has a corresponding "phase detection point" for each image pixel included in the image sensor.

Block 420 illustrates comparing the electrical signals, associated with the plurality of subpixels, to provide phase-detection auto focus for the imaging system. Function logic (e.g., as illustrated in FIG. 3) may be utilized to generate the PDAF signal based, at least in part, on a comparison between the electrical signals associated with the group of photodiodes that are optically aligned with a shared microlens. In one embodiment, the electrical signals associated with a specific photodiode for each of the plurality of subpixels (e.g., all photodiodes in a common quadrant of each subpixel) are grouped together and compared to one another to generate phase difference images. In one embodiment, the function logic generates the PDAF signal by comparing the electrical signals between adjacent photodiodes included in the group of photodiodes of a given subpixel and further comparing the electrical signals between diagonal photodiodes included in the group of photodiodes.

Block 425 shows determining whether the point of interest is in focus based, at least in part, on the comparison between the electrical signals. In one embodiment, one or more phase images are generated based on the electrical signals. For example, each subpixel includes a shared microlens optically aligned with a group of photodiodes, the electrical signal from each photodiodes included in the group of photodiodes may be utilized to generate respective phase images (i.e., four phase images each representing a quadrant of the plurality of subpixels pixel when the group of photodiodes are arranged in a two-by-two pattern). Each of the phase images may be compared to generate a PDAF signal that provides omni-directional information as to whether the point of interest is in focus across the entire image sensor.

Block 425 proceeds to block 430 if the point of interest is not in focus and adjusts optical power (e.g., provided by an objective lens) based on the comparison of the electrical signals. In other words, the comparison allows for determining if the optical power of the objective lens results in the external scene being in focus, front focused, or back focused and provides instructions to adjust the optical power accordingly. Once the optical power of the objective lens is adjusted, block 430 proceeds to block 410 to start the process again of determining whether the point of interest is in focus. If the point of interest is in focus, block 425 proceeds to block 435 for capturing an image or video frame with the imaging system.

Block 435 illustrates exposing the plurality of photodiodes to incident light associated with the external scene and subsequently reading out (e.g., via readout circuitry 388 included in imaging system 370 illustrated in FIG. 3) image signals generated in response for capturing an image or video frame with the imaging system. It is appreciated that the integration time (i.e., exposure duration) for capturing an image or video frame may be different than when generating an autofocus signal. Accordingly, the term "image signal" is utilized when referring to image or video frame capture. Image signals may be read out from photodiodes included in the plurality of photodiodes for each of the plurality of subpixels included in each image pixel of the image sensor. Additionally, or alternatively, image signals may be read out from the plurality of photodiodes associated with the polarization pixels for generating a depth map image. Collectively, the subpixels of a given image pixel may be representative of a full color (i.e., representative of the visible spectrum of electromagnetic radiation) image pixel. However, since each image pixel also includes a plurality of polarization pixels, image processing may be used to recover the full resolution of the image sensor, bin the image signals for increased sensitivity, and the like.

Block 440 shows generating a non-depth map image, in which image signals generated by the plurality of photodiodes associated with the subpixels of the image signal are read out and subsequently image processing is performed to obtain an image or video frame representative of the external scene. In some embodiments, image signals from a group of photodiodes associated with a common subpixel color filter may be averaged for each of the plurality of subpixels to generate red, green, and blue image signals for each image pixel included in the image sensor.

Block 445 shows generate a depth map image of an external scene representative of the incident light based, at least in part, on the electrical signals associated with the plurality of photodiodes. More specifically, the electrical signals associated with the plurality of subpixels provide phase information of edges of the external scene while the electrical signals associated with the plurality of polarization pixels provide relative surface angle information of the external scene. The phase information of the edges and relative surface information may be combined in the appropriate manner to generate a depth map of the external scene that can reveal relative depth information of even smooth surfaces such as a sphere.

Block 450 shows determining whether another image should be taken. If a signal, setting, or other configuration parameter indicates another image should be taken (e.g., a shutter button of the imaging system being depressed continuously), block 450 proceeds to block 455 to determine whether the same point of interest is selected or otherwise determined. If the same point of interest is selected, block 455 proceeds to block 435 for capturing an image based on the image type. However, if the same point of interest is not selected or it is desired to ensure focus of the point of interest then block 455 proceeds to block 405. If another image is not desired, block 450 proceeds to block 460 to end the image acquisition process.

The processes explained above may be implemented using software and/or hardware. The techniques described may constitute machine-executable instructions embodied within a tangible or non-transitory machine (e.g., computer) readable storage medium, that when executed by a machine (e.g., controller 120 of FIG. 1A) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel, comprising:
    a subpixel, including:
        a group of photodiodes disposed in a semiconductor material;
        a shared microlens optically aligned over the group of photodiodes, the shared microlens having a first lateral area; and
        a subpixel color filter disposed between the group of photodiodes and the shared microlens; and
    a plurality of polarization pixels, each polarization pixel included in the plurality of polarization pixels, including:
        a polarization photodiode disposed in the semiconductor material;
        an unshared microlens optically aligned over the polarization photodiode, the unshared microlens having a second lateral area less than the first lateral area of the shared microlens; and
        a polarization filter disposed between the polarization photodiode and the unshared microlens; and
    a shared color filter, wherein the polarization filter of at least two adjacent polarization pixels included in the plurality of polarization pixels are disposed between the shared color filter and the polarization photodiode of the at least two adjacent polarization pixels.

2. The image sensor pixel of claim 1, wherein the subpixel color filter has a third lateral area greater than the first lateral area of the shared microlens, wherein the polarization filter has a fourth lateral area greater than the second lateral area of the unshared microlens, and wherein the third lateral area is greater than the fourth lateral area.

3. The image sensor pixel of claim 1, wherein the group of photodiodes includes four photodiodes collectively arranged in a two-by-two pattern.

4. The image sensor pixel of claim 1, wherein the polarization filter is configured to provide linear polarization of light incident upon a corresponding one of the plurality of polarization pixels.

5. The image sensor pixel of claim 4, wherein a degree of the linear polarization is zero, forty-five, ninety, or one hundred thirty-five.

6. The image sensor pixel of claim 1, wherein the plurality of polarization pixels provide different degrees of linear polarization to incident light.

7. The image sensor pixel of claim 6, further comprising:
    a plurality of subpixels, including the subpixel, and wherein the plurality of subpixels collectively form an "L" shape disposed, at least partially, around the plurality of polarization pixels.

8. The image sensor pixel of claim 7, wherein the plurality of polarization pixels includes four polarization pixels collectively arranged in a two-by-two pattern that is, at least partially, surrounded by the plurality of subpixels.

9. The image sensor pixel of claim 1, further comprising deep trench isolation structures disposed in the semiconductor material between the polarization photodiode of adjacent polarization pixels included in the plurality of polarization pixels.

10. The image sensor pixel of claim 1, wherein a lateral area of the shared color filter is greater than a corresponding lateral area of the polarization filter of one or more of the at least two adjacent polarization pixels.

11. The image sensor pixel of claim 1, wherein a first thickness of the subpixel color filter is greater than a second thickness of the shared color filter.

12. The image sensor pixel of claim 1, wherein the group of photodiodes includes at least nine photodiodes arranged in a three-by-three pattern such that the shared microlens is optically aligned with the at least nine photodiodes and the subpixel color filter is disposed between the at least nine photodiodes and the shared microlens, wherein the plurality of polarization pixels include at least nine polarization pixels arranged in the three-by-three pattern.

13. The image sensor pixel of claim 1, wherein the shared color filter has a spectral photoresponse corresponding to green.

14. An imaging system, comprising:
- an image sensor including a plurality of photodiodes arranged as a photodiode array disposed in a semiconductor material to form a plurality of image pixels, each of the plurality of image pixels including:
  - a plurality of subpixels, each subpixel included in the plurality of subpixels including:
    - a group of photodiodes included in the photodiode array, the group of photodiodes disposed in the semiconductor material;
    - a shared microlens optically aligned over the group of photodiodes, the shared microlens having a first lateral area; and
    - a subpixel color filter disposed between the group of photodiodes and the shared microlens; and
  - a plurality of polarization pixels, each polarization pixel included in the plurality of polarization pixels including:
    - a polarization photodiode included in the plurality of photodiodes, the polarization photodiode disposed in the semiconductor material;
    - an unshared microlens optically aligned over the polarization photodiode, the unshared microlens having a second lateral area less than the first lateral area of the shared microlens; and
    - a polarization filter disposed between the polarization photodiode and the unshared microlens; and
  - a shared color filter, wherein the polarization filter of at least two adjacent polarization pixels included in the plurality of polarization pixels are disposed between the shared color filter and the polarization photodiode of the at least two adjacent polarization pixels, and
  wherein a first image pixel included in the plurality of image pixels includes a first subpixel included in the plurality of subpixels, wherein the group of photodiodes included in a first subpixel includes at least nine photodiodes arranged in a three-by-three pattern, wherein the shared microlens of the first subpixel is optically aligned over the at least nine photodiodes, and wherein the plurality of polarization pixels of the first image pixel includes at least nine polarization pixels arranged in the three-by-three pattern.

15. The imaging system of claim 14, wherein for each of the plurality of subpixels the subpixel color filter has a third lateral area greater than the first lateral area of the shared microlens, wherein for each of the plurality of polarization pixels the polarization filter has a fourth lateral area greater than the second lateral area of the unshared microlens, and wherein the third lateral area is greater than the fourth lateral area.

16. The imaging system of claim 14, wherein the polarization filter included in each of the polarization pixels is configured to provide linear polarization of incident light, and wherein the plurality of polarization pixels provides different degrees of the linear polarization.

17. The imaging system of claim 16, wherein the different degrees of linear polarization include zero, forty-five, ninety, and one hundred thirty-five.

18. The imaging system of claim 14, further comprising:
- a controller coupled to the image sensor and logic that when executed by the controller causes the imaging system to perform operations including:
  - reading out electrical signals generated in response to incident light, each of the electrical signals generated by a corresponding photodiode included in the plurality of photodiodes.

19. The imaging system of claim 18, further comprising additional logic that when executed by the controller causes the imaging system to perform further operations including:
- comparing the electrical signals associated with the plurality of subpixels to provide phase-detection auto focus (PDAF) for the imaging system.

20. The imaging system of claim 19, further comprising additional logic that when executed by the controller causes the imaging system to perform further operations including:
- generating a depth map of an external scene representative of the incident light based, at least in part, on the electrical signals, wherein the electrical signals associated with the plurality of subpixels provide phase information of edges of the external scene, wherein the electrical signals associated with the plurality of polarization pixels provide relative surface angle information of the external scene.

* * * * *